US008609981B2

(12) United States Patent
Chen et al.

(10) Patent No.: US 8,609,981 B2
(45) Date of Patent: Dec. 17, 2013

(54) P-TYPE TRANSPARENT CONDUCTIVE OXIDE FOR SOLAR CELL COMPRISING MOLYBDENUM TRIOXIDE DOPED WITH INDIUM

(75) Inventors: Han-Yi Chen, Hsinchu (TW);
Chia-Hsiang Chen, Hsinchu (TW);
Huan-Chieh Su, Changhua County (TW); Kuo-Liang Liu, Hsinchu (TW);
Tri-Rung Yew, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 102 days.

(21) Appl. No.: 13/104,744

(22) Filed: May 10, 2011

(65) Prior Publication Data

US 2012/0118386 A1 May 17, 2012

(30) Foreign Application Priority Data

Nov. 16, 2010 (TW) .............................. 99139328 A

(51) Int. Cl.
*H01L 31/00* (2006.01)
*H01B 1/02* (2006.01)
*H01B 1/08* (2006.01)

(52) U.S. Cl.
USPC ........ 136/252; 136/265; 252/518.1; 977/734; 977/762; 977/755; 977/948

(58) Field of Classification Search
CPC .................. H01L 21/02579; H01L 31/022466
USPC ........................................................ 136/265
See application file for complete search history.

(56) References Cited

U.S. PATENT DOCUMENTS

| | | | |
|---|---|---|---|
| 2003/0178058 A1* | 9/2003 | Jongerden et al. | 136/256 |
| 2007/0113885 A1* | 5/2007 | Chan et al. | 136/256 |
| 2009/0084439 A1* | 4/2009 | Lu et al. | 136/256 |
| 2010/0089444 A1* | 4/2010 | Thomsen et al. | 136/256 |
| 2011/0079273 A1* | 4/2011 | Arango et al. | 136/252 |

OTHER PUBLICATIONS

Ingler, W., Baltrus, J & Khan, S, 2004, 'Photoresponse of p-Type Zinc-Doped Iron(III) Oxide Thin Films', Journal of the American Chemical Society, vol. 126, No. 33, pp. 10238-10239. http://dx.doi.org/10.1021/ja048461y.*

(Continued)

*Primary Examiner* — Jonathan Johnson
*Assistant Examiner* — Angelo Trivisonno
(74) *Attorney, Agent, or Firm* — Muncy, Geissler, Olds & Lowe, PLLC

(57) ABSTRACT

A p-type transparent conductive oxide and a solar cell containing the p-type transparent conducting oxide, wherein the p-type transparent conductive oxide includes a molybdenum trioxide doped with an element having less than six valence electrons, the element is selected from the group consisting of alkali metals, alkaline earth metals, group III elements, group IV, group V, transition elements and their combinations. Doping an element having less than six valence electron results in hole number increase, and thus increasing the hole drift velocity, and making Fermi level closer to the range of p-type materials. Hence, a p-type transparent conductive material is generated. This p-type transparent conducting oxide not only has high electron hole drift velocity, low resistivity, but also reaches a transmittance of 88% in the visible wavelength range, and therefore it is very suitable to be used in solar cells.

5 Claims, 13 Drawing Sheets

(56) References Cited

OTHER PUBLICATIONS

Ji, Z, He, Z, Song, Y, Liu, K & Ye, Z, 2003, 'Fabrication and characterization of indium-doped p-type SnO2 thin films', Journal of Crystal Growth, vol. 253, No. 3, pp. 239-285. http://dx.doi.org/10.1016/j.jcrysgro.2003.07.003.*

Chen, H, Su, H, Chen, C, Liu, K, Tsai, C, Yen, S & Yew, T, 2011, 'Indium-doped molybdenum oxide as a new p-type transparent conductive oxide', J. Mater. Chem., vol. 21, No. 15, p. 5745.*

Singh, G, Shrivastava, S, Jain, D, Pandya, S, Shripathi, T Ganesan, V, 2010, 'Effect of indium doping on zinc oxide films prepared by chemical spray pyrolysis technique', Bull. Mater. Sci., vol. 33, No. 5, pp. 581-587.*

Bouzidi, A, Benramdane, N, Tabet-Derraz, H, Mathieu, C, Khelifa, B & Desfeux, R, 2003, 'Effect of substrate temperature on the structural and optical properties of MoO3 thin films prepared by spray pyrolysis technique', Mat. Sci. & Eng'r., vol. 97, No. 1, pp. 5-8.*

Ji, Z, Zhao, L, He, Z, Zhou, Q & Chen, C, 2006, 'Transparent p-type conducting indium-doped SnO2 thin films deposited by spray pyrolysis', Mat. Letters, vol. 60, No. 11, pp. 1387-1389.*

Barik et al., "Electrical and optical properties of reactive DC magnetron sputtered silver oxide thin films: role of oxygen," Thin Solid Films, 429 (2003), pp. 129-134.

Golshahi et al., "P-type ZnO thin film deposited by spray pyrolysis technique: The effect of solution concentration," Thin Solid Films, 518 (2009), pp. 1149-1152.

* cited by examiner

P-TYPE TRANSPARENT CONDUCTIVE OXIDE FOR SOLAR CELL COMPRISING MOLYBDENUM TRIOXIDE DOPED WITH INDIUM

FIELD OF THE INVENTION

The present invention relates to a conductive oxide, especially a positive type (p-type) transparent conductive oxide and a solar cell with the p-type transparent conductive oxide.

BACKGROUND OF THE INVENTION

As oil energy runs out, the solar cell technology development is one of the today's urgent things, nowaday many solar cells have been able to be mass-produced and applied. But because of the need to use a lot of area to absorb sunlight, the solar panels are so bulky, heavy and inconvenient for installation, resulting in its greatest weakness. If solar panels are applied on the building structure, they are usually placed on the roof which is of no use and the large area thereof can be exposed to the sun. In this way, not only the open space of the roof cannot be used for other purposes, but also if there are natural disasters such as typhoons, hurricanes and etc., the installed solar panels on the roof are blown away more easily leading to the public danger.

To solve the problem of a large area solar panel occupation and shading, a transparent solar cell has been booming in the development, if a transparent solar cell with a high optical transmittance is developed, the solar cells will be able to be installed in doors, windows and the likes of the general building. Generally windows and doors have the feature of a large area, and one of the window functions is the light transmittance. Therefore, if a high optical transmittance solar cell is developed and installed in windows and doors of the buildings, it not only solves the large area occupation and shading problem of the solar panels, but also provides a general building power source required.

In the current development, the negative type (n-type) transparent conductive oxide (TCO) has been able to achieve high conductivity, low resistivity, high optical transmittance and other requirements. However, the p-type transparent conductive oxide due to the material nature problems still cannot meet high conductivity, low resistivity, high optical transmittance requirements. For example, U. Kumar Barik et al. in "Electrical and optical properties of reactive DC magnetron sputtered silver oxide thin films: role of oxygen", Thin Solid Thin Films 492 (2003) 129-134, disclosed silver oxide as a p-type transparent conductive oxide, which achieves the advantages of high hole mobility (6.1 cm$^2$/V·s) and low resistivity (2.61×10$^{-4}$ Ω·cm), but the transmittance of less than 2% was not in line with transparent requirements. And S. Golshahi et al. in "P-type ZnO thin film deposited by spray pyrolysis technique: The effect of solution concentration", Thin Solid Thin Films 518 (2009) 1149-1152, disclosed a zinc oxide type transparent conductive oxide with the electron hole mobility of 6.31~46.9 (cm$^2$/V·s), and the optical transmittance of 60~80%, but the impedance in the range of 0.66×100~7.2×103 (Ω·cm), therefore, so far the technology can not yet meet high hole mobility, low resistivity and high optical transmittance requirements.

SUMMARY OF THE INVENTION

The primary object of the present invention is to solve the problems that the conventional p-type conductive oxides cannot simultaneously meet high hole mobility, low resistivity and high optical transmittance requirements.

To achieve the above-mentioned object, the present invention provides a p-type transparent conductive oxide which includes molybdenum trioxide doped with an element having valence electrons less than six, wherein the element with valence electrons less than six is selected from the group consisting of alkali metals, alkaline earth metals, group III elements, group IV elements, group V elements, transition elements and combinations thereof. In addition, the present invention also provides a solar cell with a p-type transparent conductive oxide, which comprises a substrate, a p-type transparent conductive layer, a light absorbing semiconductor layer and a negative conductive layer. The p-type transparent conductive layer is connected with the substrate, the p-type transparent conductive layer is formed from the p-type transparent conductive oxide; the absorption semiconductor layer is disposed on a side of the p-type transparent conductive layer away from the substrate side; the n-type conductive layer is disposed on a side of the absorption semiconductor layer oriented away from the p-type transparent conductive layer.

From the above descriptions, the p-type transparent conductive oxide of the present invention includes a molybdenum trioxide doped with an element having less than six valence electrons, the number of electron holes increases by doping the element of less than six valence electrons, and thus the hole mobility increases and the resistivity decreases such that Fermi level could be closer to the range of p-type materials, thereby to realize the conditions of high hole mobility, low resistivity and high optical transmittance. In the present invention, single-crystal nanowires and amorphous thin films can be grown, the amorphous thin film can be directly grown on flexible substrates to be applied in flexible electronic devices. Furthermore, using the p-type transparent conductive oxide, a solar cell for the practical application can be produced.

DETAILED DESCRIPTION OF THE PREFERRED EMBODIMENT

Figure 1:
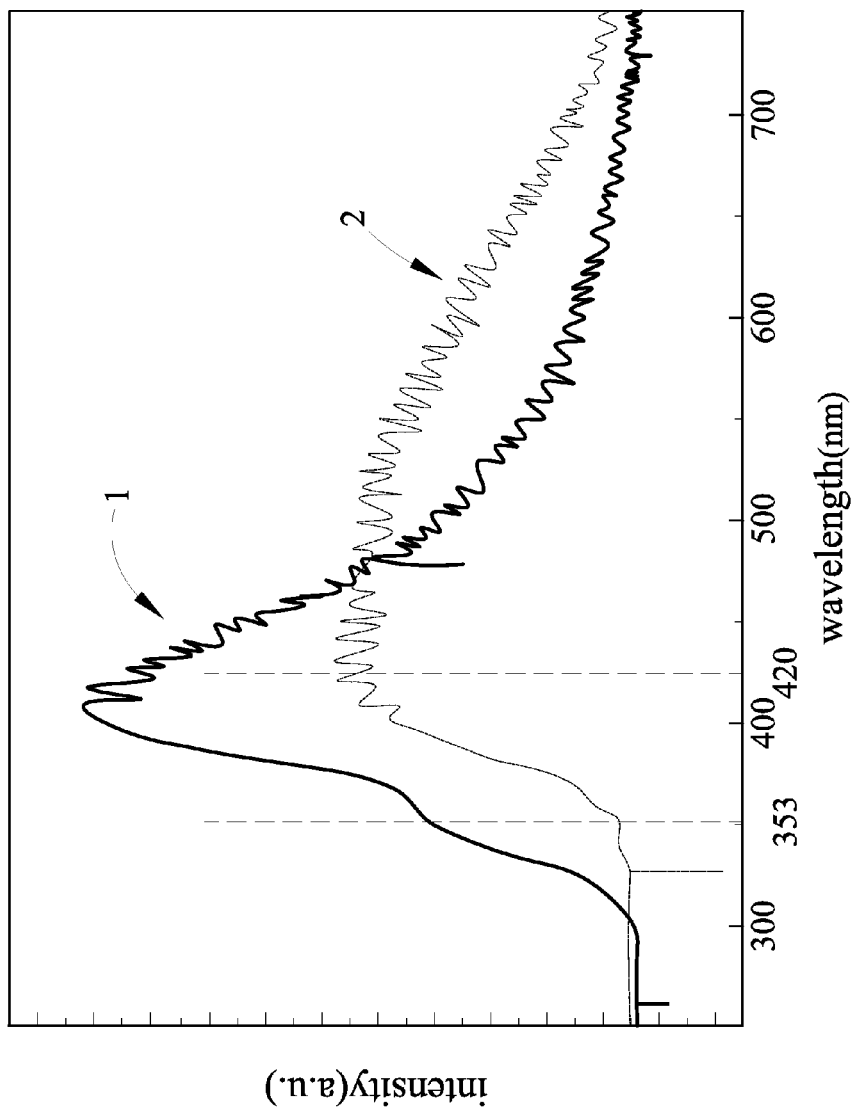
FIG. 1 is a diagram schematically showing the fluorescence emission spectrum of a preferred embodiment in the present invention.
Figure 2:
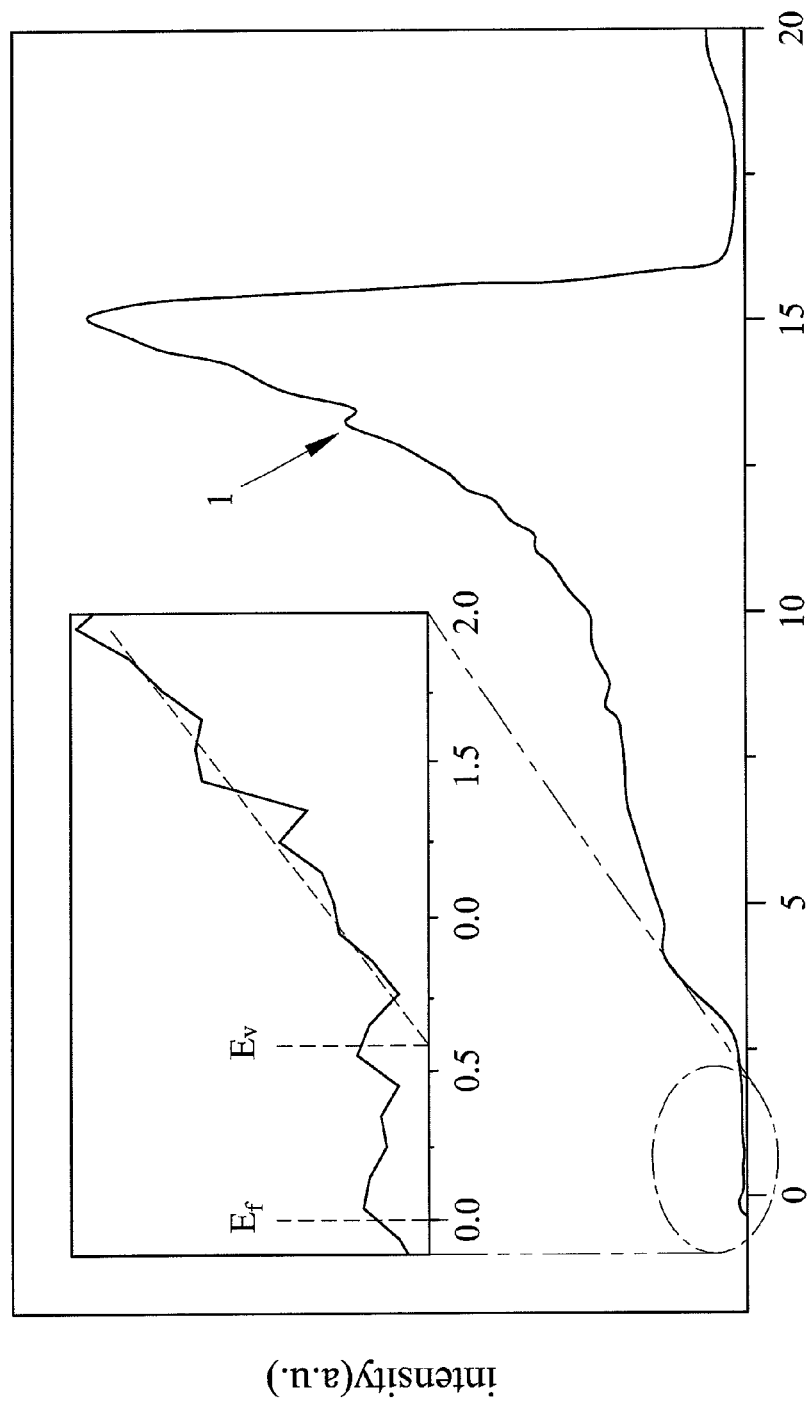
FIG. 2 is a diagram schematically showing the energy level curve of a preferred embodiment in the present invention.
Figure 3:
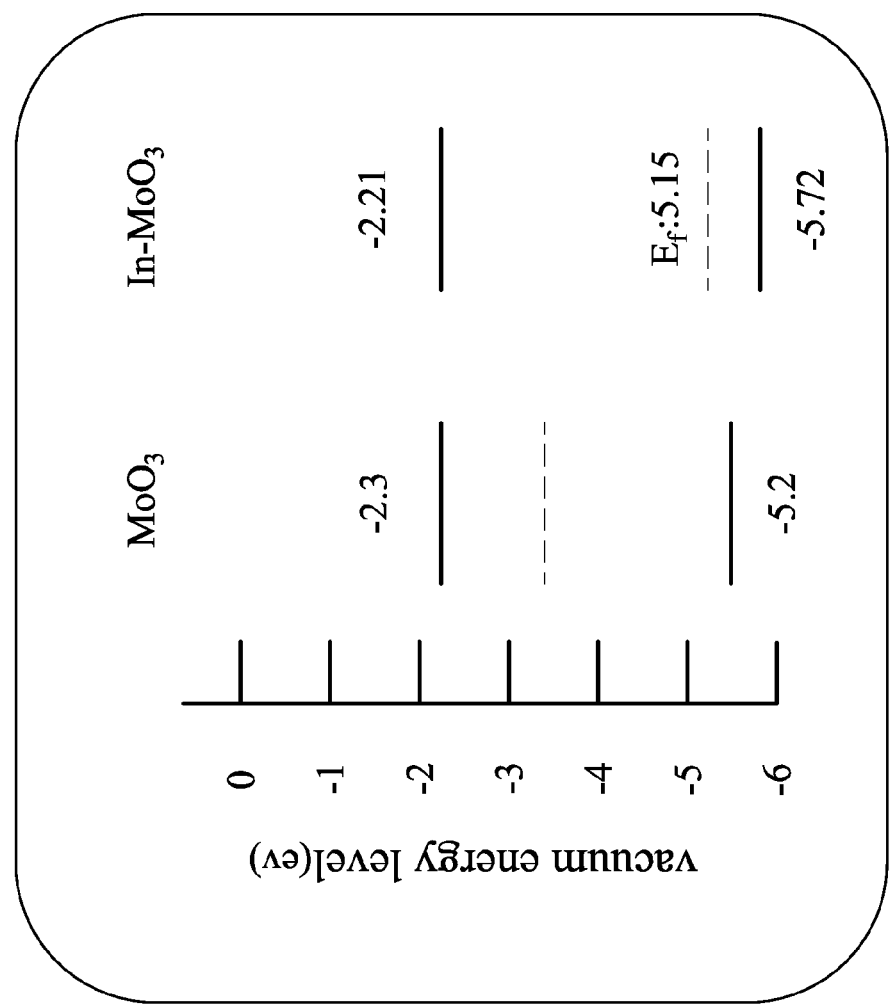
FIG. 3 is a diagram schematically showing the photoluminescence spectrum of a preferred embodiment in the present invention.

Now refer to the drawings for the detailed description and the technical content of the invention as follows:

Please refer to FIGS. 1 through 3, FIG. 1 is a diagram schematically showing the fluorescence emission spectrum of a preferred embodiment, FIG. 2 is a diagram schematically showing the energy level curve of a preferred embodiment and FIG. 3 is a diagram schematically showing the photoluminescence spectrum of a preferred embodiment according to the present invention. As shown in the figures, the present invention provides a p-type transparent conductive oxide which comprises molybdenum trioxide doped with an element having less than six valence electrons, the element having less than six valence electrons is selected from the group consisting of alkali metals, alkaline earth metals, group III elements, group IV elements, group V elements, transition elements and combinations thereof. In the present invention, because molybdenum (Mo) is a hexavalent material, wherein elements having less than six valence electrons are doped for replacing so as to generate more electron holes. In this embodiment, indium (In) is used as the element having less than six valence electrons. Since indium is a trivalent metal, after doping each doped molecule will has three more electron holes. In this embodiment, the chemical formula after doping would be In—$MoO_3$. In FIG. 1, the fluorescence emission spectrums of an indium-doped molybdenum trioxide 1 and an undoped molybdenum trioxide 2 are obtained. In FIG. 2, the values of Fermi level ($E_f$) and the valence band ($E_v$) of the indium-doped molybdenum trioxide 1 are shown. In FIG. 3, it is shown that the Fermi level ($E_f$) of the undoped molybdenum trioxide ($MoO_3$) is between those of the p-type and n-type), and closer to the n-type side, but after molybdenum trioxide doped with indium, the Fermi level ($E_f$) has decreased to −5.2 eV, very close to the p-type side, and this can be determined that molybdenum trioxide after the doping of indium becomes a p-conductive oxide.

Figure 4:
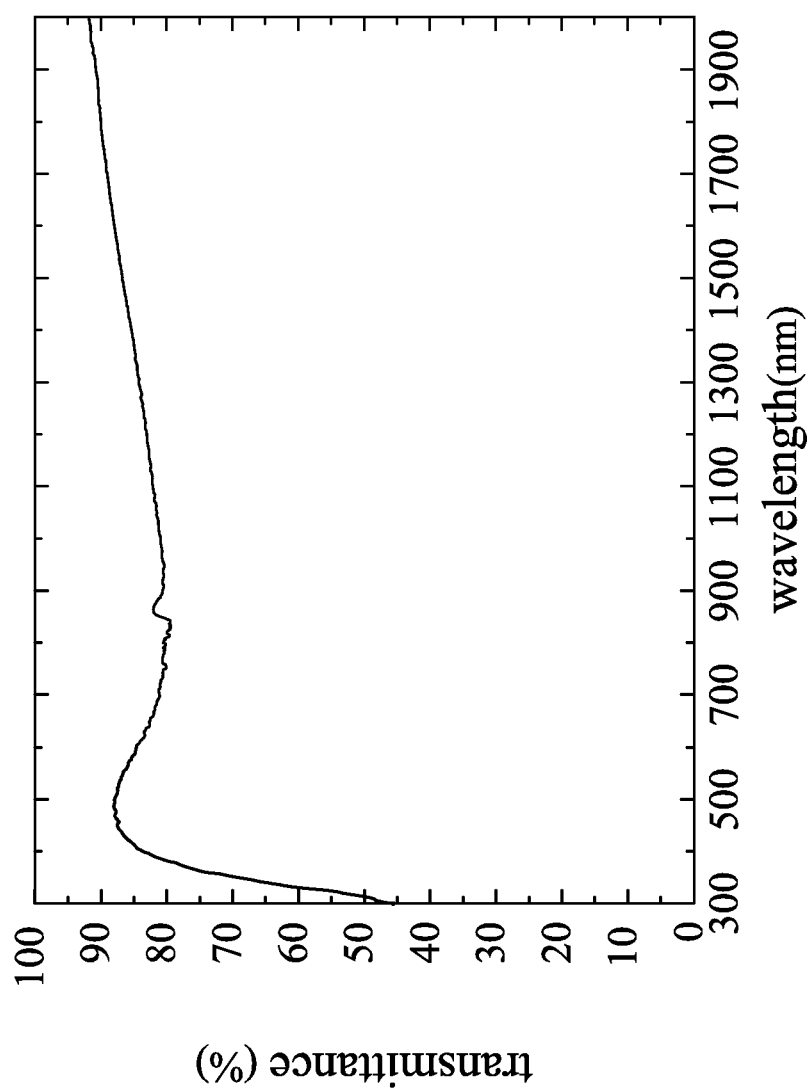
FIG. 4 is a diagram schematically showing the transmittance of different wavelengths of a preferred embodiment in the present invention.

FIG. 4 is a diagram schematically showing the transmittance of different wavelengths of a preferred embodiment in the present invention. As shown in the figure, the optical transmittance in the visible wavelength range of 390 nm to 780 nm of a thin film of 80 nm according to the present invention is greater than 80%, even at the wavelength of 485 nm, its transmittance is close to 90%, therefore, the present invention can accomplish good transmittance.

Figure 5:
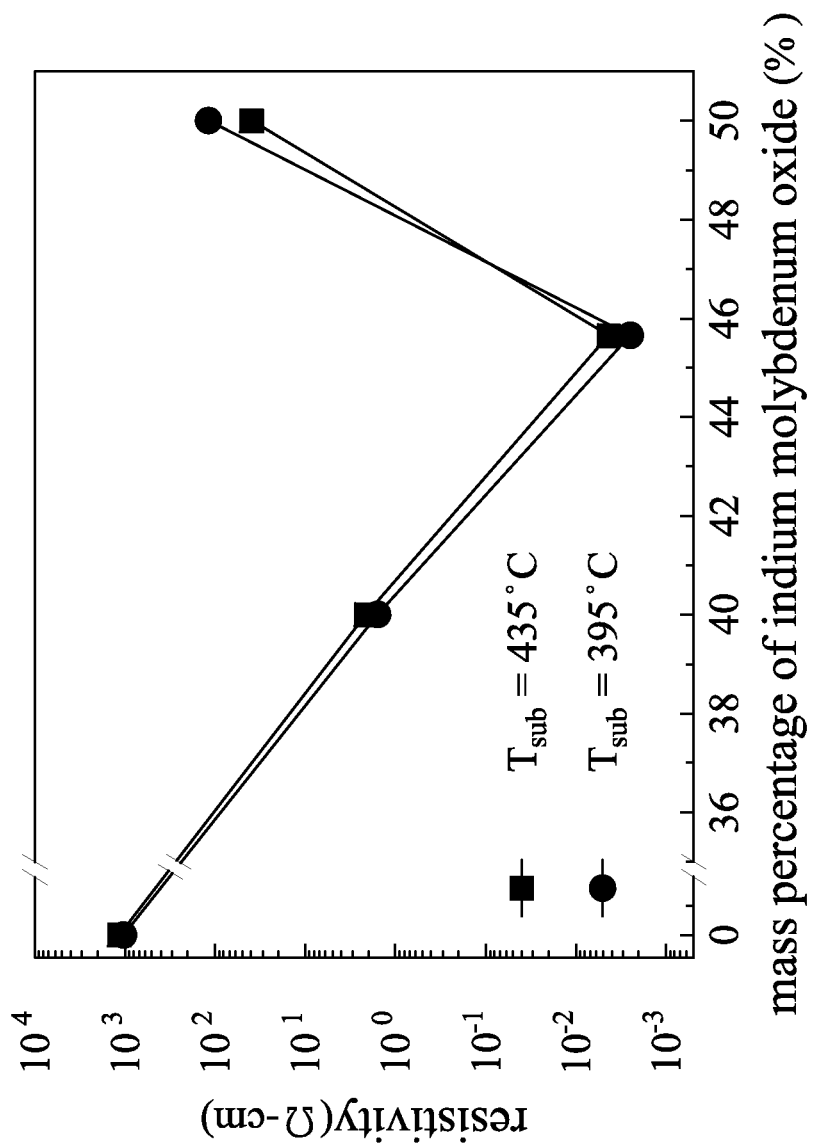
FIG. 5 is a diagram schematically showing the thin film resistivity of a preferred embodiment in the present invention.
Figure 6:
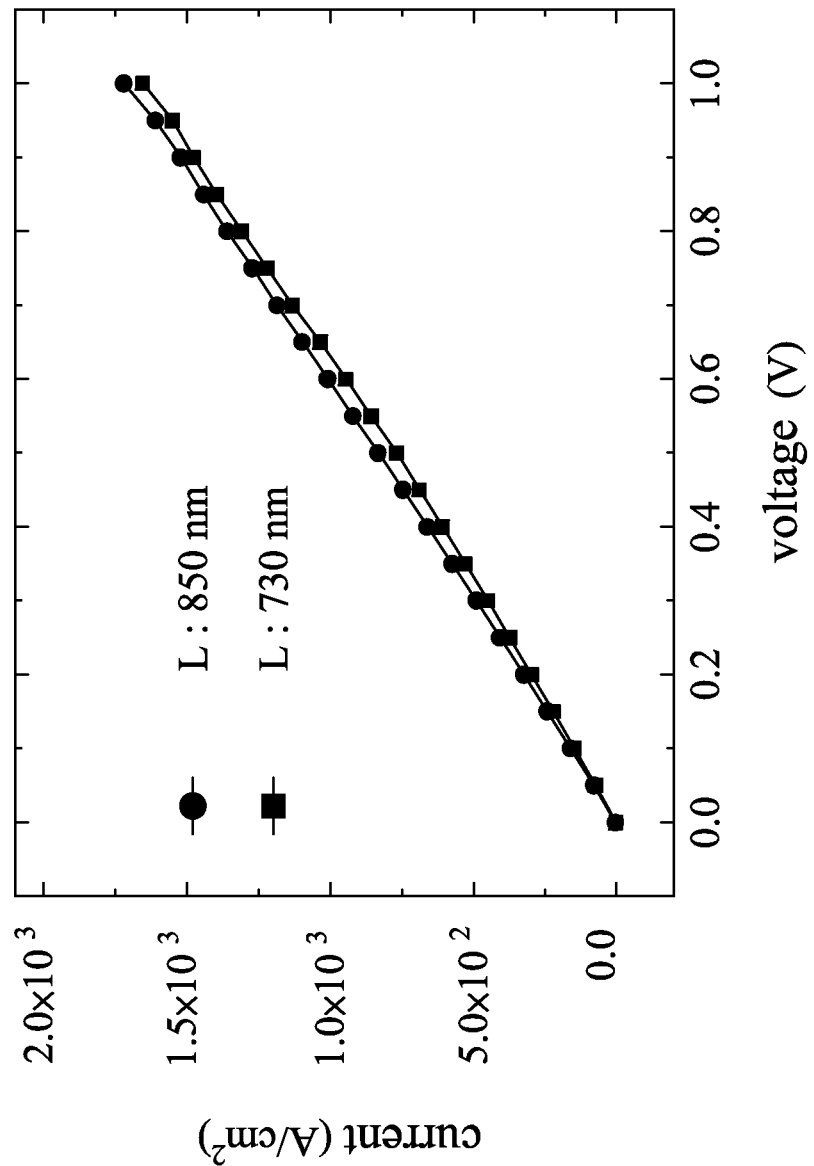
FIG. 6 is a diagram schematically showing the nanowire resistivity of a preferred embodiment in the present invention.

Referring to FIGS. 5 and 6, FIG. 5 is a diagram schematically showing the thin film resistivity of a preferred embodiment in the present invention. FIG. 6 is a diagram schematically showing the nanowire resistivity of a preferred embodiment in the present invention.

As shown in FIG. 5, after the doping with indium, the resistivity of molybdenum trioxide thin film can be decreased to $2.5 \times 10^{-3}$ Ω-cm, the hole mobility and the hole carrier concentration are increased to 11.9 $cm^2$/V·s and $2.1 \times 10^{20}$/$cm^3$ respectively. As shown in FIG. 6, after doping with indium, the molybdenum trioxide nanowire resistivity can be decreased to $5.98 \times 10^{-4}$ Ω-cm, thus the present invention can carry out good electrical conductivity.

Figure 7:
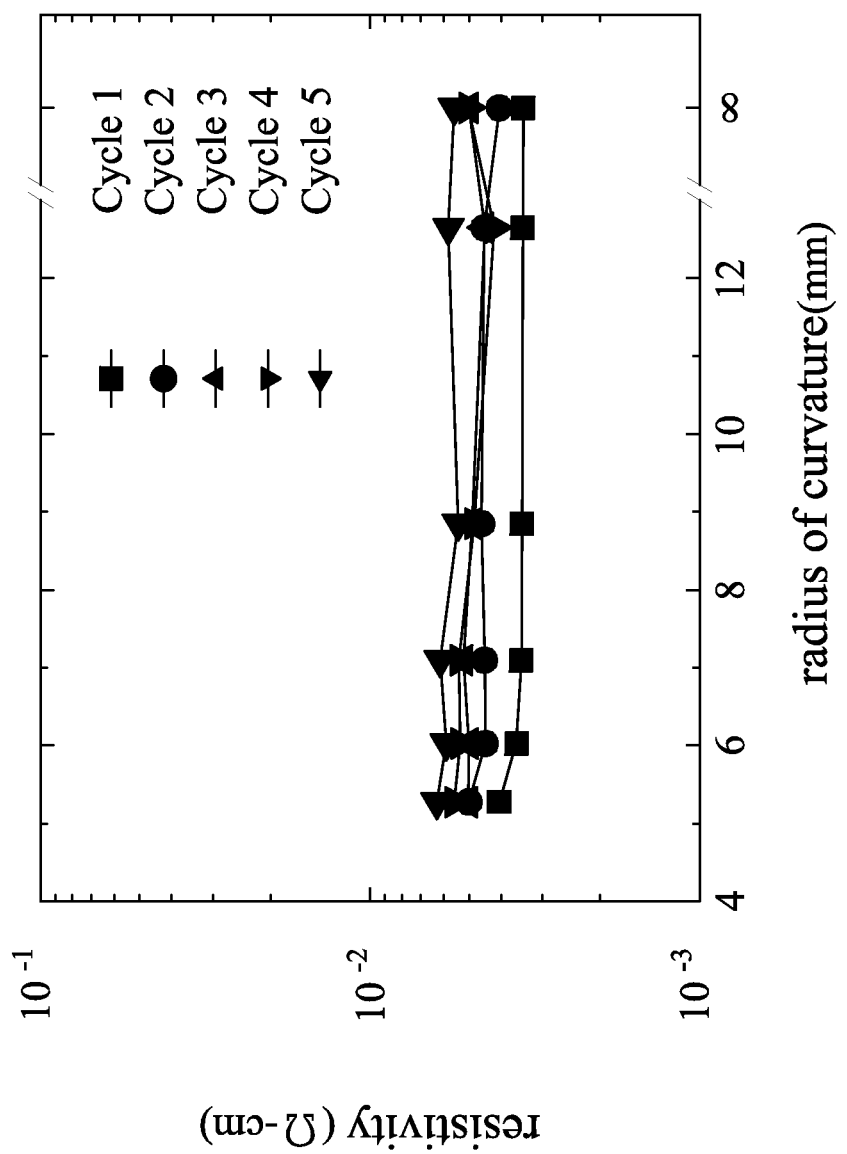
FIG. 7 is a diagram schematically showing the resistivity of an indium-doped growing amorphous molybdenum trioxide thin film on flexible substrates (polyimide) in a preferred embodiment in the present invention.

Referring to FIG. 7, it is a diagram schematically showing the resistivity of an indium-doped amorphous molybdenum trioxide thin film growing on flexible substrates (polyimide) in a preferred embodiment according to the present invention. As shown in the Figure, the substrate is bended to a curvature radius of 5.22 mm, and with repeating five cycles, the resistivity increases from original $3.4 \times 10^{-3}$ Ω-cm up to $6.3 \times 10^{-3}$ Ω-cm, which is still maintained at a low resistivity range, thus the present invention can be successfully grown on flexible substrates, and to gain good electrical conductivity.

Figure 8A:
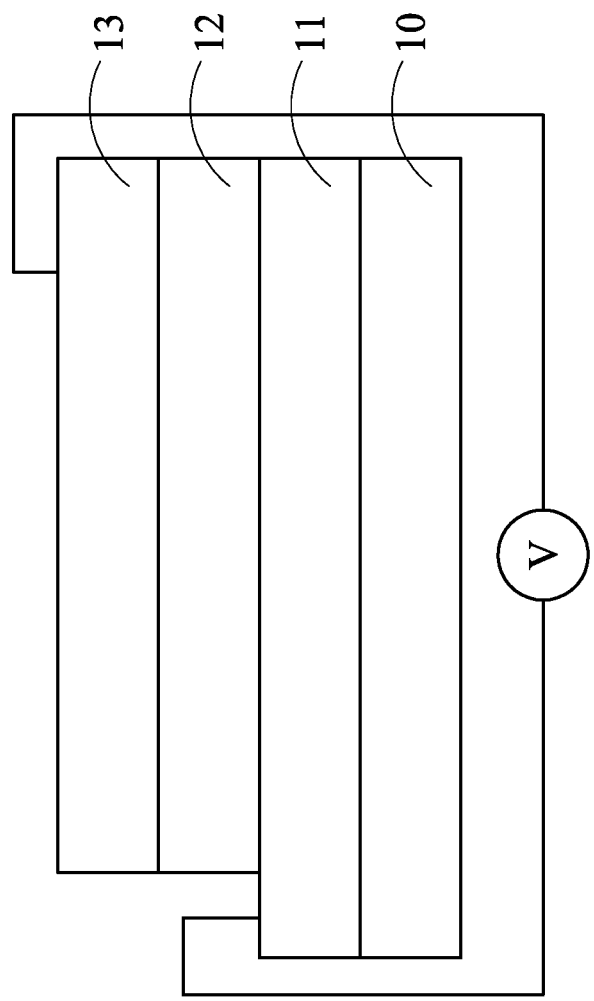
FIG. 8A is a diagram schematically showing the structure of all transparent electronic components of a preferred embodiment in the present invention.
Figure 8B:
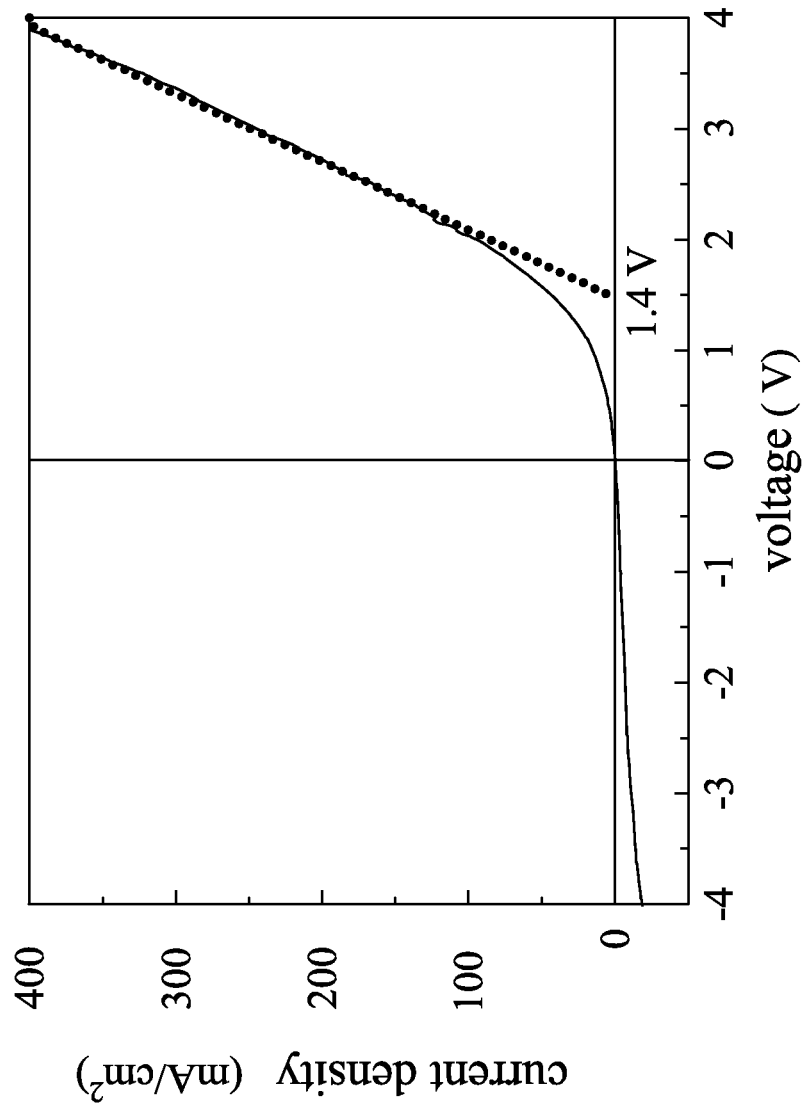
FIG. 8B is a diagram schematically showing the current-voltage curve of all-transparent electronic components of a preferred embodiment in the present invention.
Figure 9A:
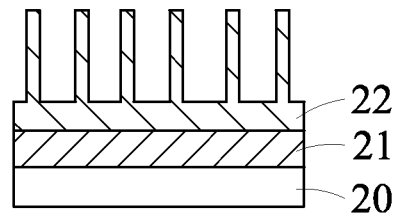
FIGS. 9A-9E is a diagram schematically showing the solar cell manufacturing process of a preferred embodiment in the present invention.
Figure 9B:
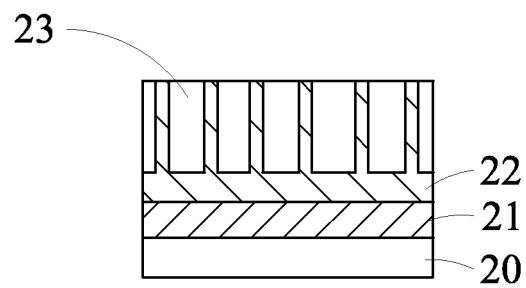
Figure 9C:
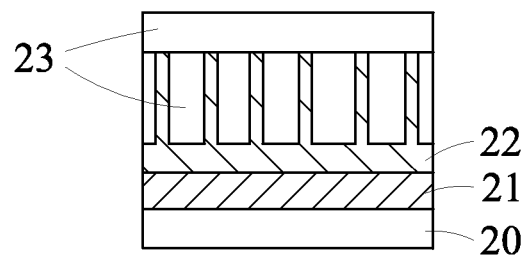
Figure 9D:
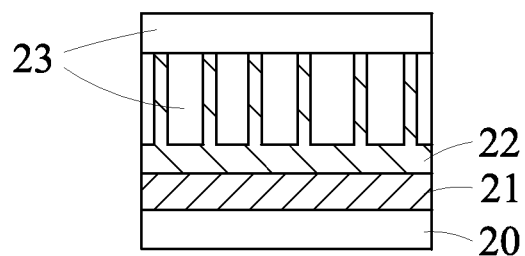
Figure 9E:
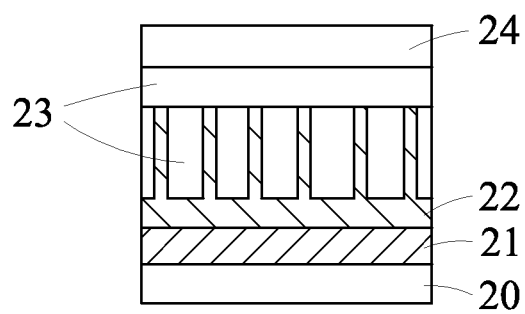

Referring to FIGS. 8A and 8B, FIG. 8A is a diagram schematically showing an application of all-transparent electronic components of a preferred embodiment in the present invention. As shown in FIG. 8A, an instrinsic type transparent conductive layer 11 (zinc alumina) and a (intrinsic) semiconductor layer 12 (zinc oxide) are sputtered on a glass substrate 10, and a molybdenum trioxide thin films doped with indium as a p-type transparent conductive oxide 13 of the present invention is grown thereon to assemble an all-transparent electronic component. As shown in FIG. 8B, the driving voltage of 1.4 eV can be obtained from the current-voltage curve of the all-transparent electronic component, it will be seen from this that the present invention can be successfully applied to the all-transparent electronic components.

Referring to FIG. 9, it is a diagram schematically showing a process of the solar cell of a preferred embodiment in the present invention. As shown in the Figure, the present invention provides a p-type transparent conductive oxide solar which includes a substrate 20, a p-type transparent conductive layer 22, a light absorbing semiconductor layer 23 and an n-type conductive layer 24. In this embodiment, and the substrate 20 is further connected with an electrode layer 21, the p-type transparent conductive layer 22 and the electrode layer 21 are connected and disposed on one side of the substrate 20, the p-type transparent conductive layer 22 is composed of the p-type transparent conductive oxide, namely the p-type transparent conductive oxide contains a molybdenum trioxide doped with an element having less than six valence electrons, and the element having less than six valence electrons is selected from the group consisting of alkali metals, alkaline earth metals, group III elements, group IV elements, group V elements, transition elements and combinations thereof, in this embodiment, the same indium doping is used as a preferred example; the light absorbing semiconductor layer 23 is set in the p-type transparent conductive layer on the side away from the substrate 20; the n-type conductive layer 24 is set in the light absorbing semiconductor layer 23 and oriented away from one side of the p-type transparent conductive layer 22.

The manufacturing process of the solar cell according to the present invention can be further explained from FIGS. 9A-9E, wherein the p-type transparent conductive layer 22 is firstly grown on the substrate 20 and the electrode layer 21. In this embodiment, the p-type transparent conductive layer 22 grows as a nanowire structure. In practical application, the p-type transparent conductive layer 22 can also be formed as a thin film, thereafter the light absorbing semiconductor layer 23 is grown on the p-type transparent conductive layer 22 to obtain a nanoparticle structure. The contact area between the p-type transparent conductive layer 22 and the light absorbing semiconductor layer 23 can be increased and more dissociated electron-hole pairs can be gained by the coordination of nanowires and nanoparaticles. Then, by sputtering, the n-type conductive layer 24 is grown on the light absorbing semiconductor layer 23. In addition, the material of the electrode layer 21 can be platinum, titanium, aluminum, silver, or their combinations, the material of the n-type conductive layer 24 can be indium tin oxide, FTO (fluorine-doped tin oxide) or aluminum zinc oxide. The light absorbing semiconductor layer 23 is selected from the group consisting of titanium dioxide, zinc oxide, and quantum dots containing elements of group III to group V. Moreover, the solar cell is prepared by a method selected from the group consisting of sputtering deposition, evaporation deposition, self assembly, chemical synthesis, sol-gel method, spin coating, chemical vapor deposition, physical vapor deposition and combinations thereof.

Figure 10A:
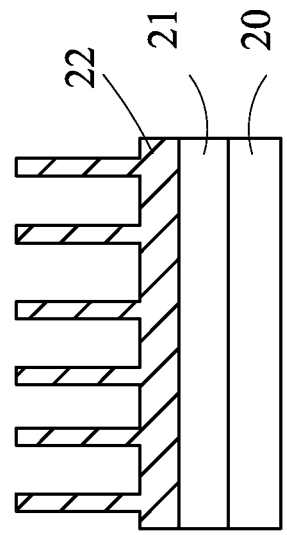
FIG. 10A is a diagram schematically showing the doping process of a preferred embodiment in the present invention.
Figure 10A:
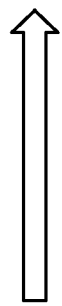
Figure 10A:
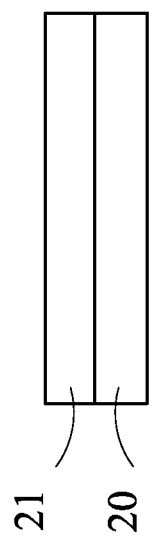
Figure 10B:
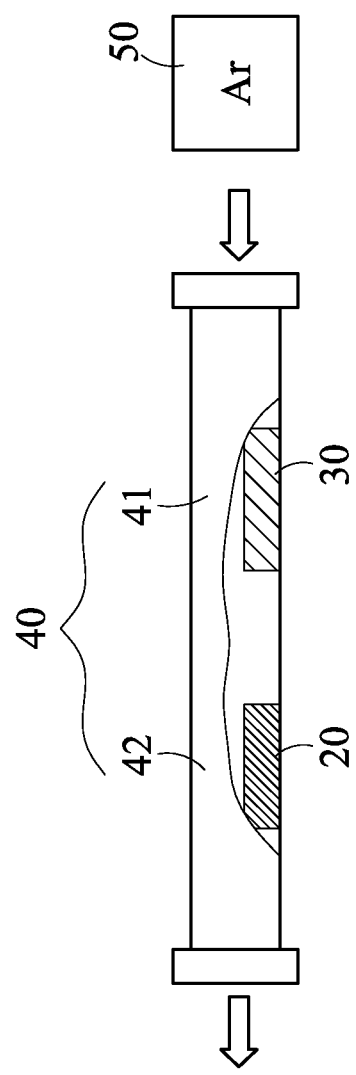
FIG. 10B is a diagram schematically showing the furnace tube manufacturing process of a preferred embodiment in the present invention.

Please refer to FIG. 10A and FIG. 10B, FIG. 10A is a diagram schematically showing the doping process of a preferred embodiment in the present invention, and FIG. 10B is a diagram schematically showing the manufacturing process by using tube furnace of a preferred embodiment in the present invention. As shown in the figures, in this embodiment, a source plate 30 is placed in a high temperature zone 41 of a tube furnace 40, and then the substrate 20 whereon the electrode layer 21 has been disposed in a low temperatures zone 42 of the tube furnace 40, and a carrier gas 50 passes through the high temperature zone 41 of the tube furnace 41. In this embodiment, the carrier gas is argon (Ar). The source material on the source plate 30 is carried by the carrier gas 50 to the low temperature zone 42 of the furnace tube 40 and deposited on the electrode layer 21 to obtain a nanowire structure so as to complete setting of the p-type transparent conductive layer 22.

In summary, the p-type transparent conductive oxide of the present inventive includes a molybdenum trioxide doped with an element having less than six valence electrons. The number of holes increases by doping the element having less than six valence electrons, thus the hole drift velocity increases and its resistivity value reduces, and it makes Fermi level closer to the range of the p-type material, thereby to achieve the conditions of high electron hole mobility, low resistivity and high optical transmittance. In the present invention, single crystal nanowires and amorphous thin films may also be grown, the amorphous thin film can be directly grown on flexible substrates and applied in flexible electronic components. Furthermore, the p-type transparent conductive oxide is applied for the solar cell production in order to carry out a practical application capability.

The details of the present invention has been described above, it is only to exemplify the present inventive preferred embodiments but not to limit the scope of the present invention. Any equivalent modification or variation according to the technical contents disclosed in the claim is to be included within the scope of the present invention.

What is claimed is:

1. A solar cell with a p-type transparent conductive oxide, comprising:
   a substrate;
   a p-type transparent conductive layer which connects with the substrate, and the p-type transparent conductive layer is composed of a p-type transparent conductive oxide containing a molybdenum trioxide thin film doped with indium having less than six valence electrons;
   a light absorbing semiconductor layer which is disposed on a side of the p-type transparent conductive layer away from the substrate; and
   an n-type conductive layer which is disposed on a side of the light absorbing semiconductor layer away from the p-type transparent conductive layer,
   wherein the p-type transparent conductive oxide has a transmittance between 80%-90% in a visible wavelength range of 390-780 nm, and
   wherein the molybdenum trioxide thin film has a resistivity of $2.5*10^{-3}$ $\Omega$-cm and a hole carrier concentration of $2.1\times10^{20}$ $cm^{-3}$ when the indium is doped in the molybdenum trioxide thin film.

2. The solar cell with the p-type transparent conductive oxide of claim 1, wherein the p-type transparent conductive layer is a thin film or a nanowire structure, and the light absorbing semiconductor layer is a nanoparticles structure.

3. The solar cell with the p-type transparent conductive oxide of claim 1, further comprising an electrode layer, the electrode layer is interposed between the substrate and the p-type transparent conductive layer, the electrode layer is made of a material selected from the group consisting of platinum, titanium, aluminum, silver and combinations thereof, the n-type conductive layer is made of a material selected from the group consisting of indium tin oxide, fluorine-doped tin oxide, aluminum zinc oxide and combinations thereof.

4. The solar cell with the p-type transparent conductive oxide of claim 1, wherein the light absorbing semiconductor layer is made of a material selected from the group consisting of dye-adsorbed titanium dioxide, zinc oxide, quantum dots of group III to group V elements and combinations thereof.

5. The solar cell with the p-type transparent conductive oxide of claim 1, wherein the solar cell is prepared by a method selected from the group consisting of sputtering deposition, evaporation deposition, self assembly, chemical synthesis, sol-gel method, spin coating, chemical vapor deposition, physical vapor deposition and combinations thereof.

* * * * *